(12) United States Patent
Mulkens et al.

(10) Patent No.: US 10,866,530 B2
(45) Date of Patent: Dec. 15, 2020

(54) LITHOGRAPHIC APPARATUS AND DEVICE MANUFACTURING METHOD

(71) Applicant: ASML NETHERLANDS B.V., Veldhoven (NL)

(72) Inventors: Johannes Catharinus Hubertus Mulkens, Valkenswaard (NL); Nicolaas Ten Kate, Almkerk (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/266,881

(22) Filed: Feb. 4, 2019

(65) Prior Publication Data

US 2019/0271920 A1    Sep. 5, 2019

Related U.S. Application Data

(63) Continuation of application No. 12/628,531, filed on Dec. 1, 2009, now Pat. No. 10,197,927.

(60) Provisional application No. 61/193,487, filed on Dec. 3, 2008.

(51) Int. Cl.
  *G03F 7/20* (2006.01)
  *G03B 27/32* (2006.01)

(52) U.S. Cl.
  CPC .......... *G03F 7/70908* (2013.01); *G03F 7/708* (2013.01); *G03F 7/7085* (2013.01); *G03F 7/70341* (2013.01); *G03F 7/70716* (2013.01); *G03F 7/70725* (2013.01); *G03F 7/70775* (2013.01); *G03F 7/70808* (2013.01); *G03F 7/70825* (2013.01); *G03F 7/70866* (2013.01); *G03F 7/70916* (2013.01); *G03B 27/32* (2013.01)

(58) Field of Classification Search
  CPC .. G03F 7/70341; G03F 7/70775; G03F 7/708; G03F 7/70866; G03F 7/70916; G03F 7/7085; G03F 7/70825; G03F 7/70808; G03F 7/70716; G03F 7/70725; G03F 7/70908
  See application file for complete search history.

(56) References Cited

U.S. PATENT DOCUMENTS

| | | | |
|---|---|---|---|
| 4,509,852 | A | 4/1985 | Tabarelli et al. |
| 6,801,301 | B2 | 10/2004 | Miyajima et al. |
| 6,987,278 | B2 | 1/2006 | Loopstra |
| 7,199,858 | B2 | 4/2007 | Lof et al. |
| 7,301,607 | B2 | 11/2007 | Hazelton et al. |
| 7,321,415 | B2 | 1/2008 | Hazelton |
| 8,134,688 | B2 | 3/2012 | Shibazaki |
| 2003/0218728 | A1 | 11/2003 | Del Puerto et al. |

(Continued)

FOREIGN PATENT DOCUMENTS

| | | |
|---|---|---|
| CN | 1687847 | 10/2005 |
| EP | 1 420 300 A2 | 5/2004 |

(Continued)

*Primary Examiner* — Michelle M Iacoletti
(74) *Attorney, Agent, or Firm* — Pillsbury Winthrop Shaw Pittman, LLP

(57) ABSTRACT

A difficulty of contamination interfering with a grid plate positional measurement system is addressed. In one embodiment contamination is prevented from coming into contact with the grating or the sensor. In an embodiment, surface acoustic waves are used to detach contamination from a surface of the grating or sensor.

21 Claims, 4 Drawing Sheets

(56) References Cited

U.S. PATENT DOCUMENTS

| | | |
|---|---|---|
| 2004/0136494 A1 | 7/2004 | Lof et al. |
| 2004/0207824 A1 | 10/2004 | Lof et al. |
| 2005/0052743 A1 | 3/2005 | Speckbacher et al. |
| 2006/0038968 A1 | 2/2006 | Kemper et al. |
| 2006/0119809 A1 | 6/2006 | Verhagen et al. |
| 2006/0139594 A1 | 6/2006 | Hara et al. |
| 2006/0139660 A1* | 6/2006 | Patrick Kwan ..... G03F 7/70716 356/614 |
| 2007/0114451 A1* | 5/2007 | Jansen ................. G03F 7/70341 250/492.1 |
| 2007/0247543 A1 | 10/2007 | Hozumi et al. |
| 2007/0263191 A1 | 11/2007 | Shibazaki |
| 2007/0263201 A1* | 11/2007 | Loopstra ............. G03F 7/70341 355/72 |
| 2008/0212046 A1 | 9/2008 | Riepen et al. |
| 2009/0168032 A1 | 7/2009 | Kate et al. |
| 2009/0237634 A1 | 9/2009 | Eussen et al. |
| 2009/0279060 A1 | 11/2009 | Direcks et al. |
| 2009/0279062 A1 | 11/2009 | Direcks et al. |
| 2010/0060868 A1 | 3/2010 | Tanasa et al. |

FOREIGN PATENT DOCUMENTS

| | | |
|---|---|---|
| JP | 57-013307 | 1/1982 |
| JP | H11-118677 | 4/1999 |
| JP | 2000-105135 | 4/2000 |
| JP | 2008-256655 | 10/2008 |
| JP | 2008-292406 | 12/2008 |
| WO | 99/49504 A1 | 9/1999 |
| WO | 2005/064405 A2 | 7/2005 |
| WO | 2007/083758 | 7/2007 |
| WO | 2008/029757 | 3/2008 |

\* cited by examiner

LITHOGRAPHIC APPARATUS AND DEVICE MANUFACTURING METHOD

This application is a continuation of U.S. patent application Ser. No. 12/628,531, filed Dec. 1, 2009, which claims priority and benefit under 35 U.S.C. § 119(e) to U.S. Provisional Patent Application No. 61/193,487, filed on Dec. 3, 2008. The entire content of each of the foregoing applications is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid can be used. An embodiment of the present invention will be described with reference to liquid. However, a fluid may be suitable, particularly a wetting fluid, an incompressible fluid and/or a fluid with a higher refractive index than air, desirably a higher refractive index than water. A fluid excluding gas is particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic, a fluorohydrocarbon, and/or an aqueous solution.

Submersing the substrate or substrate and substrate table in a bath of liquid (see, for example, U.S. Pat. No. 4,509, 852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that the direction of flow of the liquid is shown by arrows in FIGS. 2 and 3.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

A type of positional measurement device used in a lithographic apparatus, and in particular in an immersion lithographic apparatus (of any type), comprises a grating, a radiation source and a sensor. The grating and sensor are mounted on the different objects which are movable relative to one another and whose relative position is desired to be measured. For example, the grating may be attached to one of a substrate table and a reference frame of a lithographic apparatus and the sensor may be attached to the other of the substrate table and reference frame. The sensor senses radiation redirected by the grating to measure the relative position between the substrate table and the reference frame.

SUMMARY

The presence of contamination (e.g., a particle, a droplet of liquid, etc.) on the sensor or grating of the above positional measurement device can be a problem. This is because the contamination can interfere with the radiation impinging on or redirected by the grating/sensor and thereby cause a false reading. This is a particular difficulty in immersion lithography systems where splashing of liquid may occur resulting in a chance of a droplet falling on the grating or sensor. Because of the proximity of the grating and sensor to where liquid is handled in an immersion apparatus, it is likely that if measures are not taken to mitigate the circumstances, a droplet of liquid will land on the sensor or grating and cause measurement results to be faulty.

It is desirable, for example, to provide a lithographic apparatus in which the chances of a false measurement in a grating and sensor positional measurement device being made are reduced.

According to an aspect of the invention, there is provided a lithographic apparatus comprising: a substrate table configured to hold a substrate; a reference frame; a grating attached to the substrate table or the reference frame; a sensor attached to the other of the substrate table or the reference frame, the sensor configured to detect radiation redirected by the grating to measure the relative position between the substrate table and the reference frame; and a barrier associated with the grating, the barrier positioned to hinder contamination from reaching the grating and having a surface facing away from the grating at a distance between 300 μm and 5 mm from the grating.

According to an aspect of the invention, a lithographic apparatus comprising: a substrate table configured to hold a substrate; a reference frame; a grating attached to the substrate table or the reference frame; a sensor attached to the other of the substrate table or the reference frame, the sensor configured to detect radiation redirected by the grating to measure the relative position between the substrate table and the reference frame; and a barrier associated with the grating or sensor, the barrier positioned to hinder contamination from reaching the associated grating or sensor and having a surface facing away from the associated grating or sensor at a distance between 300 μm and 5 mm from the associated grating or sensor.

In an embodiment, the surface of the barrier is liquidphobic or has a liquidphobic coating. In an embodiment, the barrier is integral with the grating. In an embodiment, a plate forms the barrier and the grating is formed on a backside of the plate. In an embodiment, the barrier comprises a plate. In an embodiment, the barrier is in contact with the grating or the sensor. In an embodiment, the barrier is positioned distal from the associated grating or sensor such that a gap is present between the barrier and associated grating or sensor. In an embodiment, the apparatus further comprises a gas supply configured to provide a gas to the gap. In an embodiment, the gas supply is a conditioned gas supply such that gas with a certain temperature can be supplied to the gap. In an embodiment, the apparatus further comprises a frame, wherein the barrier is attached to the frame. In an embodiment, the barrier surrounds a space adjacent the associated grating or sensor. In an embodiment, the apparatus further comprises a hole in the barrier to allow equalization of pressure of gas in the space and outside of the space. In an embodiment, the barrier comprises a polymer, desirably a fluoropolymer such as PTFE. In an embodiment, the barrier is between 0.1 and 2 μm thick, desirably less than 1 μm thick. In an embodiment, the barrier comprises a plurality of separate barriers each being positioned adjacent a different portion of the associated grating or sensor. In an embodiment, the grating comprises a plurality of lines on a surface. In an embodiment, the lines are lines of chromium. In an embodiment, the barrier is removably attached to the apparatus. In an embodiment, the barrier, in use, is at an angle to horizontal such that any liquid droplets on the barrier move under the influence of gravity. In an embodiment, the apparatus further comprises a contamination removal device configured to remove contamination from the surface of the barrier. In an embodiment, the distance is desirably greater than 500 μm, more desirably greater than 1 mm. In an embodiment, the distance is desirably less than 4 mm, more desirably less than 3 mm.

According to an aspect of the invention, there is provided a lithographic apparatus comprising: a substrate table configured to hold a substrate; a reference frame; a grating attached to the substrate table or the reference frame; a sensor attached to the other of the substrate table or the reference frame, the sensor configured to detect radiation redirected by the grating to measure the relative position between the substrate table and the reference frame; and a contamination removal device configured to remove contamination from a surface by changing a property of the surface, the surface being a surface of (i) the sensor, or (ii) the grating, or (iii) a barrier at least partly covering the sensor or grating, or (iv) any combination selected from (i)-(iii).

In an embodiment, the contamination removal device is configured to remove particles and/or droplets from the surface. In an embodiment, the property is surface topography or electrostatic potential. In an embodiment, the contamination removal device comprises a transducer configured to induce surface acoustic waves into the surface. In an embodiment, the contamination removal device comprises a plurality of electrodes formed on or in the surface and a voltage applicator configured to apply voltage to the electrodes.

According to an aspect of the invention, there is provided a device manufacturing method comprising projecting a patterned beam of radiation onto a substrate held on a substrate table, wherein a position of the substrate table relative to the projection system is measured using a grating and a sensor, wherein a barrier is positioned to hinder contamination from reaching the grating or sensor, the barrier having a surface facing away from the associated grating or sensor at a distance between 300 μm and 5 mm from the associated grating or sensor.

According to an aspect of the invention, there is provided a method of removing a particle and/or droplet on or preventing a particle and/or droplet from adhering to a surface of a grating, a sensor or a barrier at least partly covering the sensor or the grating, the method comprising changing a property of the surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
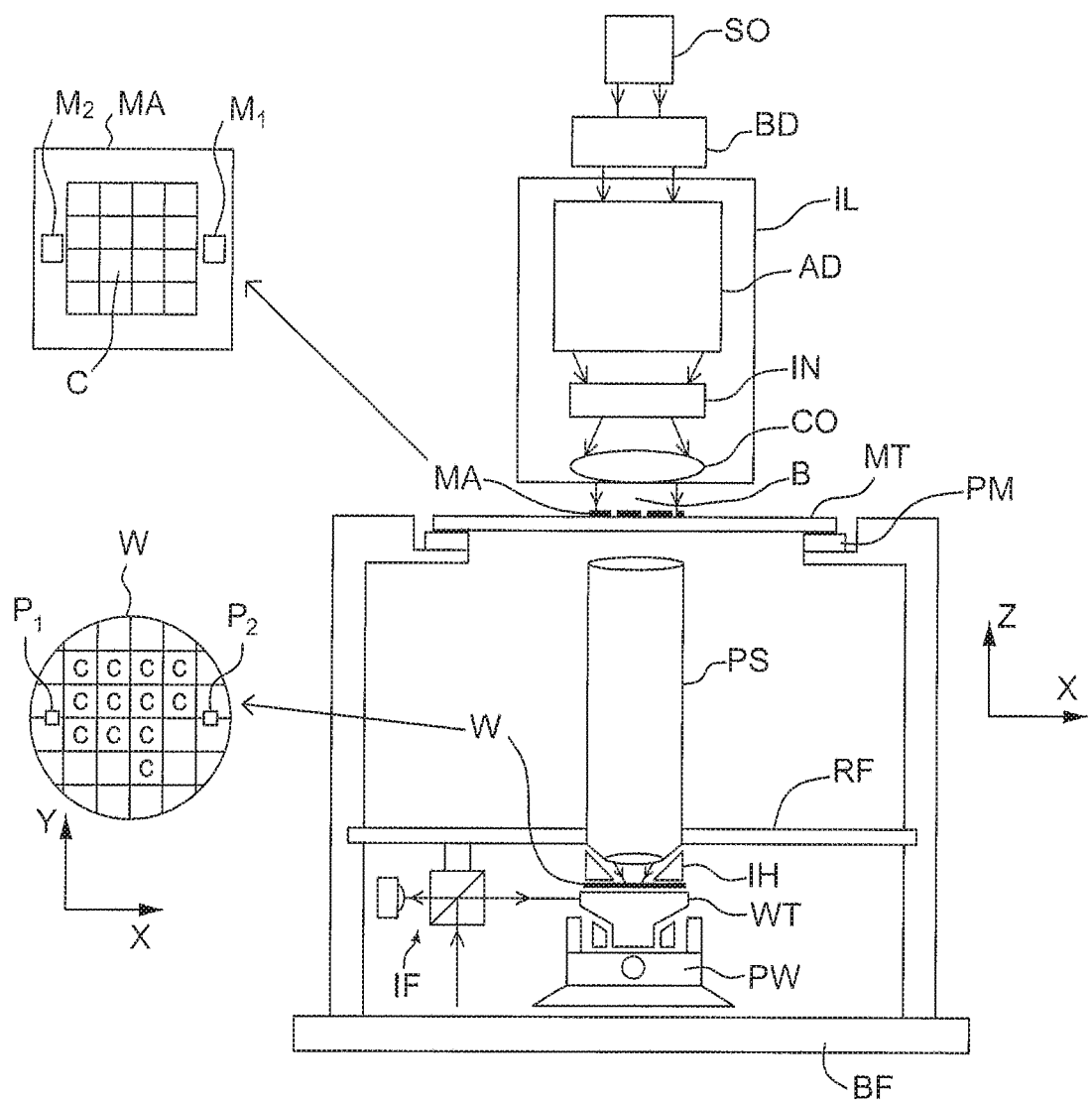
FIG. 1 depicts a lithographic apparatus according to an embodiment of the invention.
Figure 2:
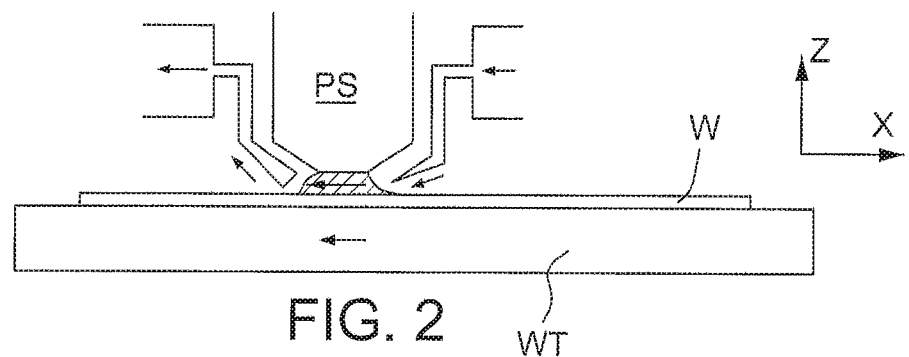
FIGS. 2 and 3 depict a liquid supply system for use in a lithographic projection apparatus.
Figure 3:
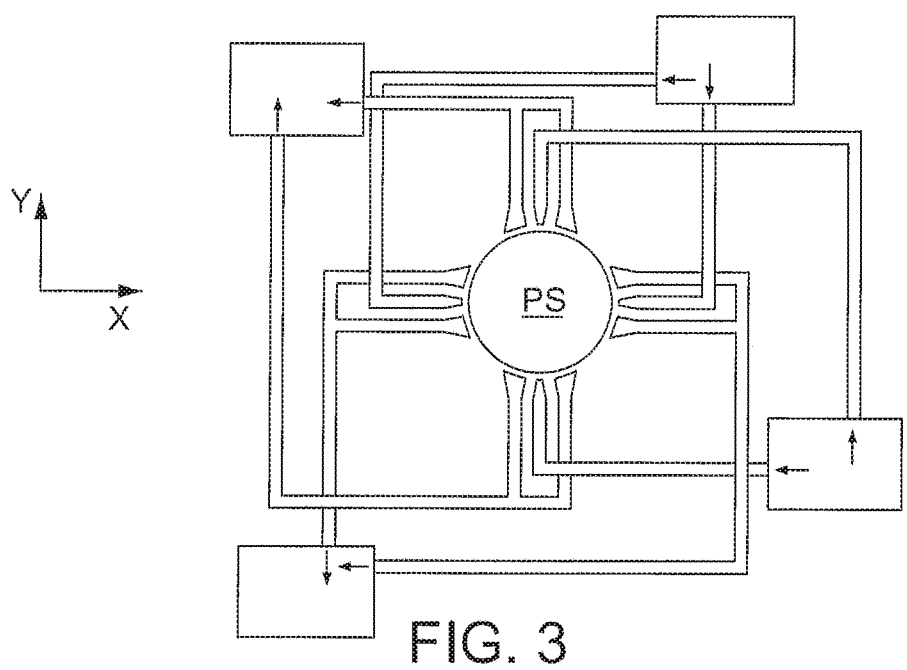
Figure 4:
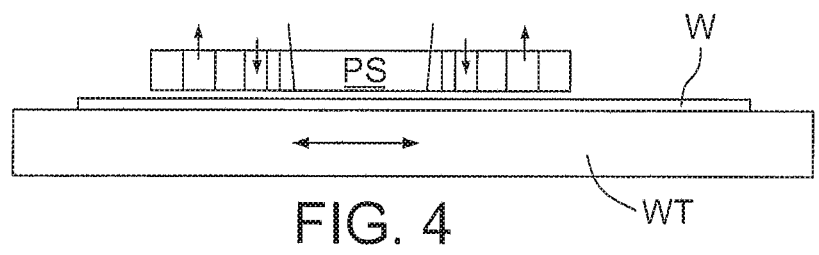
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In this latter case, the lithographic apparatus may be configured to allow the illuminator IL to be mounted thereon and optionally detachable and may be, for example, separately provided by the lithographic apparatus manufacturer or another supplier.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement in which substantially the whole of the substrate and optionally part of the substrate table is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area.

A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
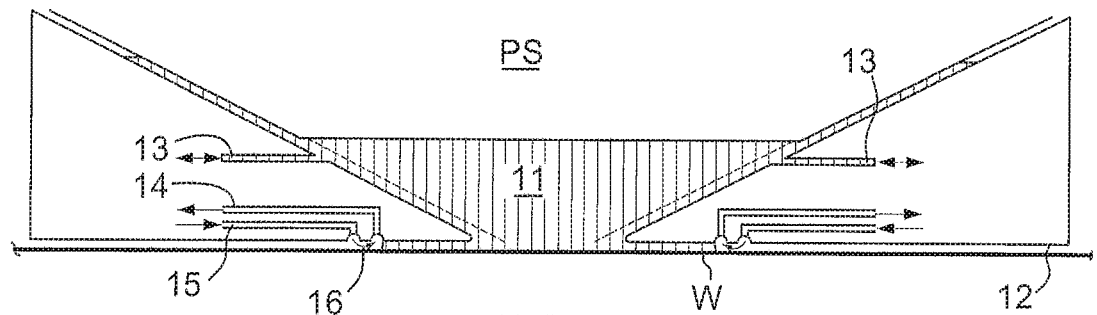
FIG. 5 depicts a further liquid supply system for use in a lithographic projection apparatus.

Another arrangement which has been proposed is to provide the liquid supply system with a liquid confinement structure which extends along at least a part of a boundary of the space between the final element of the projection system and the substrate table. Such an arrangement is illustrated in FIG. 5. The liquid confinement structure is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system or fluid handling structure with a barrier member or fluid confinement structure 12, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a gas seal or fluid seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

An embodiment of the present invention can be applied to any type of lithographic apparatus, particularly an immersion apparatus.

The example of FIG. 5 is a so called localized area arrangement in which liquid is only provided to a localized area of the top surface of the substrate W at any one time. Other arrangements are possible, including fluid handling systems which make use of a single phase extractor (whether or not it works in two phase mode) as disclosed, for example, in United States patent application publication no US 2006-0038968. In an embodiment, a single phase extractor may comprise an inlet which is covered in a porous material which is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 µm. In an embodiment, the porous material is at least slightly liquidphilic (e.g., hydrophilic), i.e. having a contact angle of less than 90° to the immersion liquid, e.g. water. Another arrangement which is possible is one which works on a gas drag principle. The so-called gas drag principle has been described, for example, in United States patent application publication no. US 2008-0212046 and U.S. patent application No. 61/071,621 filed on 8 May 2008. In that system the extraction holes are arranged in a shape which desirably has a corner. The corner may be aligned with the stepping and scanning directions. This reduces the force on the meniscus between two openings in the surface of the fluid handing structure for a given speed in the step or scan direction compared to if the two outlets were aligned perpendicular to the direction of scan. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. patent application No. 61/136,380 filed on 2 Sep. 2008.

Figure 6:
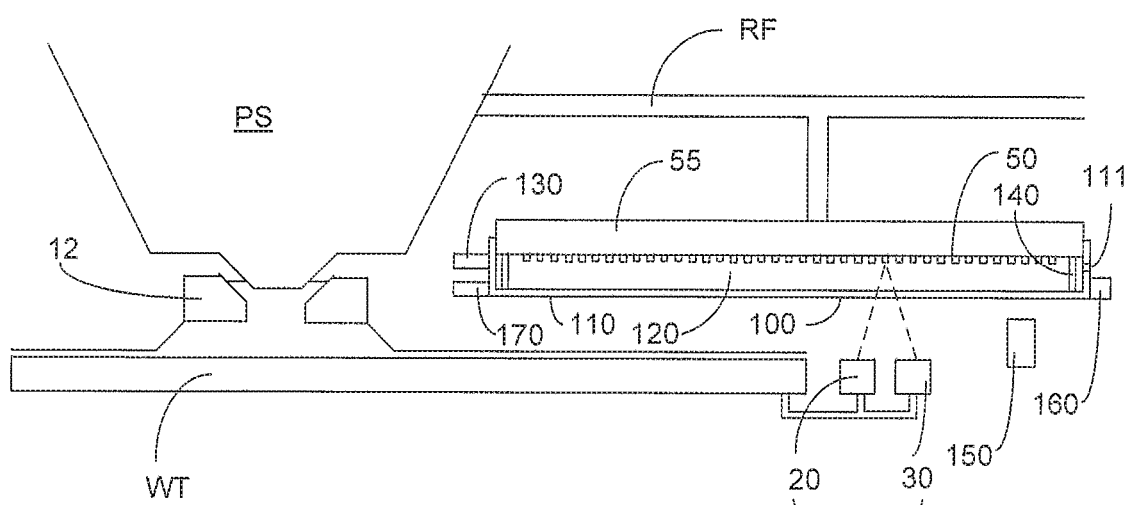
FIG. 6 is a schematic illustration, in cross-section, of a grating and sensor positional measurement device of an immersion lithographic apparatus according to an embodiment of the present invention.

FIG. 6 shows, in cross-section, an immersion lithographic apparatus which uses a grating and sensor positional measurement device. An embodiment of the invention is equally applicable to a non-immersion lithographic apparatus.

FIG. 6 illustrates schematically, in cross-section, a substrate table WT and a liquid supply system 12 as well as a projection system PS. As can be seen, the apparatus depicted is a so called all wet system in which a film of liquid covers the whole of the top surface of the substrate table WT. However, an embodiment of the invention is equally applicable to other types of apparatus.

In order to determine the position of the substrate table WT relative to the projection system PS, a grating and sensor positional measurement device is used. In the embodiment of FIG. 6 the sensor 20 is attached to the substrate table WT and the grating 50 is attached to a reference frame RF, which may be a so called metrology frame. The relative position of the grating 50 to the projection system PS is known and remains substantially constant because the position of the projection system PS relative to the reference frame RF is known. The reference frame RF of a lithographic apparatus may be mounted with passive or active gas-mounts on a base frame BF (referring to FIG. 1) to filter any external disturbances such as vibrations in the factory floor. In this way, the optical column of the projection system PS may be held in a substantially stationary position. During a scanning movement of the substrate table WT, it is desired to know the position of the substrate table WT with respect to the optical column. Therefore, the positional measurement device is provided to determine the position of the substrate table WT with respect to the reference frame RF. In one embodiment, the sensor 20 is attached to the reference frame RF while the grating 50 is formed on or attached to the substrate table WT. Such an embodiment is described with reference to FIG. 8 below.

The grating 50 comprises a plurality of lines or spots, for example chromium lines or spots, on a surface. The surface could be the surface of a plate 55, for example. Together the plate 55 and grating 50 form a grid plate.

The plate 55 is desirably made of a low coefficient of thermal expansion material. For example, a low coefficient of thermal expansion glass, glass ceramic or ceramic may be used such as Zerodur™.

The lines of the grating 50 are, for example, a plurality of parallel lines (1 dimensional). However, another form of grating 50 could be used. For example, the grating 50 could be a plurality of lines in a first direction as well as a plurality of lines in a second direction wherein the first and second directions are substantially perpendicular, for example (2 dimensional).

A beam of radiation is directed towards the grating 50, for example, by a radiation source 30. In one embodiment the radiation source 30 produces light of a wavelength of about 600 nm, for example. In one embodiment the radiation source 30 produces light of a wavelength of about 780 nm. However, the exact wavelength is not critical. The radiation source is attached to the reference frame RF. The radiation source 30 may also or instead be attached to the substrate table WT. The beam of radiation directed to the grating 50 by the radiation source 30 is reflected and/or diffracted by the grating 50 and this radiation is then detected by the sensor 20. Together the sensor 20 and radiation source 30 form an encoder 40.

Figure 7:
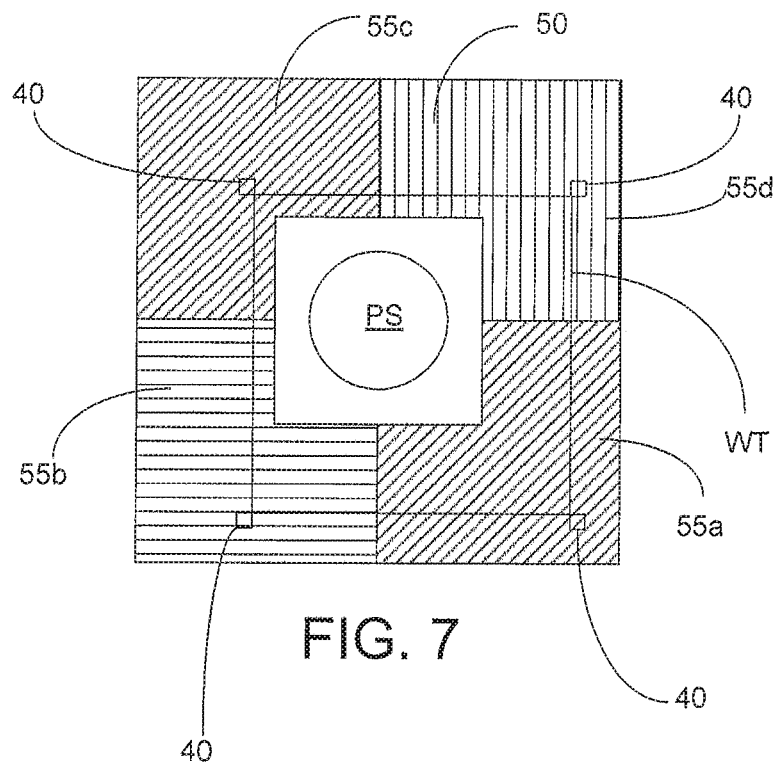
FIG. 7 depicts, in plan, the apparatus of FIG. 6.

Positional measurement is carried out by measuring the position of the sensor 20 with respect to the grating 50 in one or more degrees of freedom. As is illustrated in FIG. 7, which is a plan view of the system of FIG. 6, a plurality of sensors 20 and radiation sources 30 are attached to the substrate table WT. Each encoder 40 is capable of measuring a position of the substrate table WT in two degrees of freedom, making position measurement in six degrees of freedom possible. Using the encoder-type measurement system a position measurement with high accuracy is possible. Any other suitable configuration of encoder heads may be applied. In the embodiment of FIG. 7 there are at least three encoders on the substrate table WT and desirably four. This allows translational and rotational movement of the substrate table WT to be detected. Also, as illustrated in FIG. 7, the grating 50 is split into four separate gratings 50a, 50b, 50c, 50d. The lines of each grating 50a, 50b, 50c, 50d may have any orientation with respect to each other. In one embodiment the lines of each grating 50a, 50b, 50c, 50d are non parallel and non orthogonal with respect to each other.

The grating 50 comprises a central hole for the optical column of the projection system PS and is mounted on the reference frame RF with a number of mounting devices.

The presence of a droplet of liquid (for example immersion liquid) or of a contaminant particle on the grating 50 can lead to measurement errors. This is because the radiation beam from the radiation source 30 either before or after it is redirected by the grating 50 can have one or more of its properties (e.g. direction of travel, direction of polarization, intensity) changed thereby leading to a measurement error when the sensor 20 detects the radiation which has had its one or more properties changed (i.e. interfered with).

In an embodiment of the present invention, a barrier 100 is used. The barrier 100 is positioned relative to the grating 50 so as to hinder contamination (e.g., a droplet and/or a particle) from reaching the associated grating 50.

The barrier 100 has a surface 110 which faces away from the grating 50. Any contamination which adheres to the barrier 100 will adhere to that surface 110. The surface 110 is arranged such that any contamination which adheres to it will be far enough away from a focal plane at which a radiation beam from the radiation source 30 focuses on the grating 50 so that the contamination does not interfere with the measurement. That is, the contamination will be out of focus to the encoder 40 comprising the sensor 20 and radiation source 30.

In this way, even though the contamination is present, it will not substantially interfere with the reading made by the sensor positional measurement system.

A maximum droplet size which can adhere onto the surface 110 (taking, for example, water as the immersion liquid) is about 1.8 mm in diameter. This is for a surface 110 with a static contact angle of 0°. At a static contact angle of 80°, the maximum droplet size is more like 0.6 mm in diameter. For a static contact angle of 140°, the maximum droplet diameter is about 0.1 mm. Based on this knowledge it is possible to calculate a range of distances of the surface 110 from the grating 50 at which most droplets will be out of focus as described above. It is likely that any contaminant particles will be of a similar size. As will be clear from the below, any smaller droplets or particles will automatically be out of focus if the surface 110 is far enough for larger droplets or particles to be out of focus.

An equation can be written which determines the distance the surface 110 should be from the grating 50 in order for the contamination to be out of focus. The equation is distance>diameter of contamination/tan($\theta$) wherein $\theta$ is the opening angle of the optics of the sensor 20. A typical opening angle $\theta$ is 10°. Therefore, for a contaminant diameter of about 100 μm, the distance between the surface 110 and the grating 50 should be at least 567 μm. For a contaminant of about 0.6 mm diameter, the distance should be at least 3 mm. There are practical limitations to the distance. There is only a given amount of space available for the barrier 100. If the barrier 100 is too far from the grating 50, it gets close to the top of the substrate table WT and is thereby more likely to be contaminated (e.g., splashed with liquid). If the distance is too low, large contaminants will interfere with the radiation beam from the radiation source 30. Therefore, in an embodiment of the present invention, the distance is desirably between 300 µm and 5 mm. Such a distance is suitable to ensure that contaminants of a size up to about 0.7 mm (which are the likely biggest sizes) do not affect the positional measurement reading. In one embodiment, the distance is less than 4 mm. In an embodiment, the distance is less than 3 mm. In an embodiment, the distance is more than 500 µm, or more than 1 mm.

In one embodiment, the surface 110 is between 300 µm and 3 mm away from the grating 50. This should be far enough so that any contaminant will be out of focus to the encoder 40 comprising the sensor 20 and radiation source 30 but not such a great distance that it would result in the surface 110 being more likely to attract more contamination (because it is closer to the substrate table WT and therefore, e.g., immersion liquid).

The barrier 100 helps ensures that any stray contaminants are out of focus to the sensor 20 and thereby do not disrupt the reading. Further, when a droplet dries, it may leave behind a drying stain. Any such drying stain would also be out of focus. The barrier 100 is cheaper and simpler to replace or clean than a grating 50.

The barrier 100 could be made of any suitable material. A material used for a pellicle to protect a patterning device is suitable. For example, a fluoropolymer, such as PTFE, may be suitable. In an embodiment the barrier 100 may be a flexible polymer. In an embodiment the material is liquidphobic. For example, the immersion liquid may make a static contact angle (at room temperature and at atmospheric pressure) with the material of greater than 90°, desirably greater than 100°, more desirably greater than 110°, more desirably greater than 120, 130, 140 or 150°. The higher the contact angle, the smaller the maximum droplet size which can adhere to the barrier 100. In one embodiment the static contact angle is less than 180°. In one embodiment the barrier 100 may be 0.7 µm thick, desirably between 0.2 µm and 1.5 µm thick. Other polymers may be suitable. The material of the barrier 100 is sufficiently transparent to the wavelength of radiation from the radiation source 30 such that a meaningful signal can be detected by the sensor 20.

Other materials for the barrier 100 may be suitable. For example, quartz or Zerodur™ may be suitable. In this case the barrier 100 is relatively stiff. In this embodiment the barrier 100 may be made thicker, for example between 0.1 and 0.3 mm thick. In one embodiment, the barrier 100 may be comprised of a relatively thick plate (1-4 mm) which is attached directly to the plate 55 of the grating 50, with or without a gap between the barrier 100 and the grating 50. An advantage of a hard or stiff or thick barrier 100 is that the barrier 100 may provide some protection to the grating 50 in the case of a collision.

In the embodiment of FIG. 6 a gap 120 exists between the grating 50 and the barrier 100. In one embodiment a conditioned gas supply 130 may be provided. The conditioned gas supply 130 provides gas of a certain temperature to the gap 120. This helps avoid temperature fluctuations in the grating 50 which could otherwise lead to positional measurement errors. A conditioning device (not shown in FIG. 6) is present on the other side of the plate 55 for the same purpose.

A frame 140 is provided to which the barrier 100 may be attached. The barrier 100 may be detachable from the frame 140. This helps in replacement and/or cleaning of the barrier 100. In one embodiment, instead of attaching the barrier 100 to the plate 55 of the grating 50, the barrier 100 could be attached directly to the reference frame RF.

In one embodiment no gap 120 is provided between the barrier 100 and the grating 50. The barrier 100 and grating 50 may be integral. For example, the grating 50 may be defined on the surface of the plate 55 facing away from the sensor 20 and radiation source 30. That is, any lines or spots which make up the grating 50 are formed on the surface of the plate 55 facing away from the sensor 20. In this way, any contamination would be present on a surface of the plate 55 which is a distance away from the grating 50. Thus, the plate 55 itself would form the barrier 100 and the surface on which any contamination could adhere would be at a distance from the grating 50 so that any contamination on the surface would be out of focus to the sensor 20.

In one embodiment the barrier 100 is made of a material and/or has a coating which is liquidphobic to the immersion liquid. In an embodiment the material is liquidphobic. For example, the immersion liquid may make a static contact angle with the material of between 90 and 180°, desirably greater than 100°, more desirably greater than 110° or greater than 120°. This can help in preventing droplets from adhering to the surface 110 and/or make them easier to be removed from the surface 110.

It may be necessary from time to time (for example, every day, each lot, or each substrate) to clean the surface 110 of the barrier 100. One way of doing this would be to provide a gas knife 150 to blow a stream of gas onto the surface 110 and thereby remove contamination (e.g., particles and/or droplets).

An additional or alternative way of removing contamination is to use a contamination removal device 160 which removes contamination (e.g., particles and/or droplets) by changing a property of the surface 110. For example, surface acoustic waves (SAW) could be introduced to the surface 110 by a transducer configured to induce surface acoustic waves. This varies the surface topography of the surface 110 with time (i.e. surface waves are introduced into it). This change in surface topography of the surface 110 (i.e. shape of the surface, which is a property of the surface) with time can help in the removal of contamination. By property positioning and configuring the SAW generator, the acoustic waves may remove to a large extent droplets, chemical contamination and/or particles present on the lower surface of the barrier 100. Besides this, if the SAW generator is activated, it may prevent these droplets, chemical contamination and/or particles to ever attach themselves to the surface 110 in the first place. It will be appreciated it may not always be possible (or even needed) to have the SAW generator activated, as the acoustic waves in the barrier 100 may have a negative influence on the positional measurement and/or motion of the substrate table WT.

It may be possible to make sure the acoustic waves move through the barrier 100 in such a way that contamination attached to the barrier 100 is moved over the surface 110 of the barrier 100 to a location where they can do less harm, or can effectively be removed. Besides configuring the acoustic wave generator itself, tilting the barrier 100 a bit may help.

Alternatively or additionally, a plurality of electrodes could be formed on the surface 110 and by applying a voltage to the electrodes the electrostatic potential of the surface 110 (a property of the surface 110) could be varied. Such a variation in electrostatic potential can be used to move contamination to the edge of the surface 110 where it could be collected or at least where it will not interfere with the radiation beam from the radiation source 30. Electrostatic moving of droplets is explained in greater detail in U.S. patent application No. 60/996,736, filed on 3 Dec. 2007.

In an embodiment, where a barrier 100 of a flexible polymer is used, it may not be possible to induce surface acoustic waves. However, in this case (as well as in others) it may be possible to shake the barrier 100 and thereby remove any adhering contamination.

In the case of flexible polymer being used as the barrier, it may be possible to have a supply roll of polymer at one end and a collecting roll at the other end. The polymer is unrolled from the supply roll and wound up at the other end to expose fresh polymer. This can be done on a regular or even constant basis. Alternatively it can be done once the surface 110 of a given length of polymer has become too contaminated for the positional measurement device to operate with the desired degree of accuracy.

Although in relation to FIG. 6 the barrier 100 and various contamination removal devices have been described with relation to the grating 50, all or some of these devices could equally well alternatively or additionally be applied to the sensor 20 or the radiation source 30. For example, if droplets land on the sensor 20 or the radiation source 30, the signal will not affect the measured position but may attenuate the signal. Therefore, an error in positional result will not occur (contrary to the case where if that droplet is on the grating 50), but no position at all may be measured because the signal strength is too low. In one embodiment, no barrier 100 is present. Instead, at least one particle removal device 160, 170 which changes a property of the surface of the grating 50 or the surface of the sensor 20 or radiation source 30 is/are present.

In one embodiment the barrier 100 is wrapped around the frame 140 such that a space adjacent the grating 50 is enclosed by the grating 50 and the barrier 100. This helps prevent particles from finding their way onto the grating 50 at the edges of the barrier 100. However, in this case it may be necessary to equalize pressure in the gap 120 and outside of the gap 120. To achieve this one or more holes 111 can be provided in one or more edges of the barrier 100 which one or more edges are substantially perpendicular to the plane of the surface of the grating 50.

A labyrinth seal (i.e. a seal which seals by presenting a tortuous path from one end to the other) may be provided around such one or more holes to help prevent contamination entering the gap 120. In one embodiment, a filter may be used to filter any gas passing through such one or more holes into the gap 120.

In one embodiment the barrier 100 is arranged to be at an angle to horizontal. In this way any contamination (e.g., droplets) may move to one edge of the barrier 100 where it may be collected under the influence of gravity or where it may remain.

FIG. 7 illustrates, in plan, the arrangement of FIG. 6. In FIG. 7 four grid plates 55a, 55b, 55c, 55d are illustrated which surround the projection system PS. The dimensions of the grid plates are chosen such that at least three (3) encoders 40 on the substrate table WT are positioned under a grid plate 55 at any one time for any position of substrate table WT (at which the position is to be measured by the grid plate/sensor positional detector).

Each grating 50 could be provided with one or more barriers 100 so that the entire surface of the grating 50 is covered by a barrier 100. Desirably only one barrier 100 is used per grating 50 so that none of the grating 50 is covered by a frame.

Figure 8:
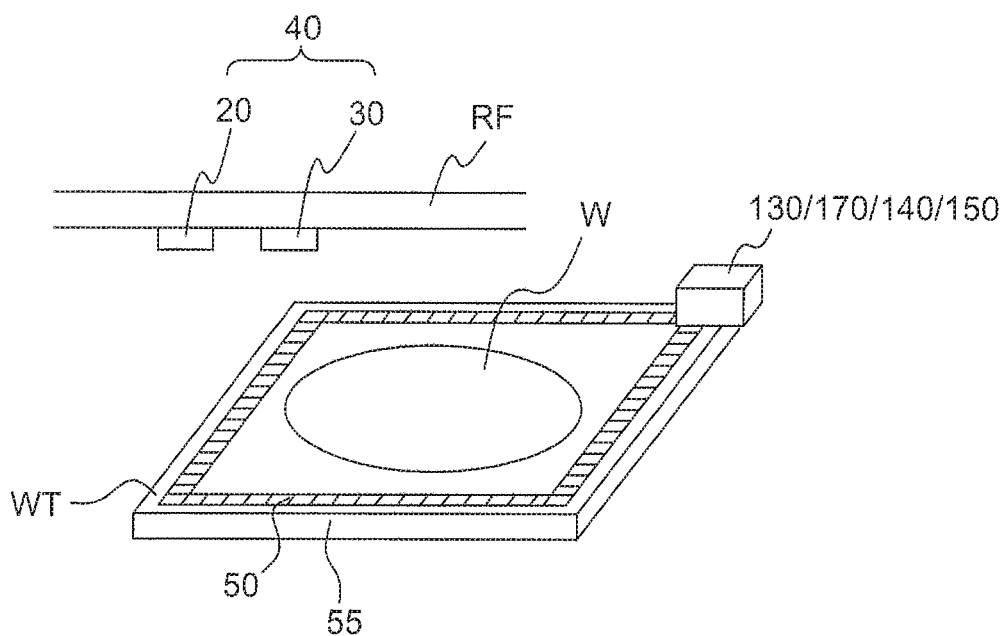
FIG. 8 depicts, in perspective view, a substrate table of an embodiment of the present invention.

FIG. 8 illustrates an embodiment in which the grid plate 55 or the grating 50 is formed on a top surface of the substrate table WT surrounding a substrate W. The barrier 100 is omitted from FIG. 8 for clarity. In this case the encoder 40 comprising the sensor 20 and radiation source 30 is attached to the reference frame RF. In this case, as with the embodiment of FIG. 6, the barrier could be provided over the grating 50 and/or over the sensor 20 and/or over the radiation source 30. The various contamination removal devices can be used on the grating 50, the sensor 20, the radiation source 30 and/or a barrier 100 over any one of those objects, as in the embodiment of FIG. 6.

As will be appreciated, any of the above described features can be used with any other feature and it is not only those combinations explicitly described which are covered in this application.

In an aspect, there is provided there is provided a lithographic apparatus comprising: a substrate table configured to hold a substrate; a reference frame; a grating attached to the substrate table or the reference frame; a sensor attached to the other of the substrate table or the reference frame, the sensor configured to detect radiation redirected by the grating to measure the relative position between the substrate table and the reference frame; and a barrier associated with the grating, the barrier positioned to hinder contamination from reaching the grating and having a surface facing away from the grating at a distance between 300 µm and 5 mm from the grating. Optionally, the surface of the barrier is liquidphobic or has a liquidphobic coating. Optionally, the barrier is positioned distal from the associated grating or sensor such that a gap is present between the barrier and associated grating or sensor. Desirably, the apparatus further comprises a gas supply to provide a gas to the gap. Desirably, the gas supply is a conditioned gas supply such that gas with a certain temperature can be supplied to the gap. Desirably, the apparatus further comprises a frame, wherein the barrier is attached to the frame. Desirably, the barrier surrounds a space adjacent the associated grating or sensor. Desirably, the apparatus further comprises a hole in the barrier to allow equalization of pressure of gas in the space and outside of the space. Optionally, the barrier comprises a polymer, desirably a fluoropolymer such as PTFE. Optionally, the barrier is between 0.1 and 2 µm thick, desirably less than 1 µm thick. Optionally, the barrier is integral with the grating. Desirably, a plate forms the barrier and the grating is formed on a backside of the plate. Optionally, the barrier comprises a plate. Optionally, the barrier is in contact with the grating or the sensor. Optionally, the barrier comprises a plurality of separate barriers each being positioned adjacent a different portion of the associated grating or sensor. Optionally, the grating comprises a plurality of lines on a surface. Desirably, the lines are lines of chromium. Optionally, the barrier is removably attached to the apparatus. Optionally, the barrier, in use, is at an angle to horizontal such that any liquid droplets on the barrier move under the influence of gravity. Optionally, the apparatus further comprises a contamination removal device to remove contamination from the surface of the barrier. Optionally, the distance is desirably greater than 500 µm, more desirably greater than 1 mm. Optionally, the distance is desirably less than 4 mm, more desirably less than 3 mm.

In an aspect, there is provided a lithographic apparatus comprising a substrate table configured to hold a substrate; a reference frame; a grating attached to the substrate table or the reference frame; a sensor attached to the other of the substrate table or the reference frame, the sensor configured to detect radiation redirected by the grating to measure the relative position between the substrate table and the reference frame; and a contamination removal device configured to remove contamination from a surface by changing a property of the surface, the surface being a surface of (i) the sensor, or (ii) the grating, or (iii) a barrier at least partly covering the sensor or grating, or (iv) any combination selected from (i)-(iii). Optionally, the contamination removal device is configured to remove particles and/or droplets from the surface. Optionally, the property is surface topography or electrostatic potential. Optionally, the contamination removal device comprises a transducer to induce surface acoustic waves into the surface. Optionally, the contamination removal device comprises a plurality of electrodes formed on or in the surface and a voltage applicator to apply voltage to the electrodes.

In an aspect, there is provided a device manufacturing method comprising projecting a patterned beam of radiation onto a substrate held on a substrate table, wherein a position of the substrate table relative to the projection system is measured using a grating and a sensor, wherein a barrier is positioned to hinder contamination from reaching the grating or sensor, the barrier having a surface facing away from the associated grating or sensor at a distance between 300 µm and 5 mm from the associated grating or sensor.

In an aspect, there is provided a method of removing a particle and/or droplet on or preventing a particle and/or droplet from adhering to a surface of a grating, a sensor or a barrier at least partly covering the sensor or the grating, the method comprising changing a property of the surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table for a lithographic apparatus, the substrate table comprising:
    a support body having a support surface configured to contact a substrate, the support body having an upper surface;
    a measurement system component attached to the substrate table, the measurement system component either comprising a sensor configured to detect radiation redirected by a grating to measure a relative position between the substrate table and the grating or comprising the grating; and
    a barrier associated with the measurement system component, the barrier positioned to hinder contamination from reaching the associated grating or sensor of the measurement system component, wherein an upper surface of the barrier is horizontally spaced apart by an open gap from the upper surface of the support body.

2. The substrate table of claim 1, wherein the surface of the barrier is liquidphobic or has a liquidphobic coating.

3. The substrate table of claim 1, wherein the barrier is integral with the associated grating or sensor of the measurement system component.

4. The substrate table of claim 1, wherein the barrier comprises a plate.

5. The substrate table of claim 1, wherein the barrier is in contact with the associated grating or sensor of the measurement system component.

6. The substrate table of claim 1, wherein the barrier is positioned distal from the associated grating or sensor of the measurement system component such that a gas gap is present between the barrier and associated grating or sensor of the measurement system component.

7. The substrate table of claim 6, further comprising a gas supply configured to provide a gas to the gap.

8. The substrate table of claim 6, wherein the barrier defines and surrounds a gas space between the barrier and the associated grating or sensor of the measurement system component.

9. The substrate table of claim 8, further comprising a hole in the barrier to allow equalization of pressure of gas between the space and an environment outside of, and contacting, the barrier.

10. The substrate table of claim 1, wherein the barrier is between 0.1 and 2 µm thick or between 0.1 and 0.3 mm thick.

11. The substrate table of claim 1, wherein the barrier comprises a plurality of separate barriers each being positioned adjacent a different associated grating or sensor of the measurement system component.

12. The substrate table of claim 1, wherein the barrier is removably attached to the substrate table.

13. The substrate table of claim 1, wherein the measurement system component comprises the sensor.

14. A lithographic apparatus comprising:
the substrate table of claim 1;
a projection system configured to project a radiation beam onto a substrate supported by the substrate table; and
a liquid supply system configured to supply liquid to a space between the projection system and the substrate.

15. The substrate table of claim 1, wherein the measurement system component is mounted on a bracket attached to and protruding from the support body.

16. A substrate table for a lithographic apparatus, the substrate table comprising:
a support body having a support surface configured to contact a substrate, the support body having an upper surface;
a measurement system component attached to the substrate table, the measurement system component either comprising a sensor configured to detect radiation redirected by a grating to measure a relative position between the substrate table and the grating or comprising the grating;
a barrier associated with the measurement system component, the barrier positioned to hinder contamination from reaching the associated grating or sensor of the measurement system component; and
a temperature conditioning device configured to cause, at a location behind a surface of the barrier, a temperature change in the associated grating or sensor of the measurement system component back toward a nominal temperature for the associated grating or sensor of the measurement system component,
wherein an upper surface of the barrier is horizontally spaced apart by an open gap from the upper surface of the support body.

17. The substrate table of claim 16, wherein the upper surface of the barrier is essentially co-planar with the upper surface of the support body.

18. The substrate table of claim 16, wherein the upper surface of the barrier is liquidphobic or has a liquidphobic coating.

19. The substrate table of claim 16, wherein the measurement system component is mounted on a bracket attached to and protruding from the support body.

20. A lithographic apparatus comprising:
the substrate table of claim 16;
a projection system configured to project a radiation beam onto a substrate supported by the substrate table; and
a liquid supply system configured to supply liquid to a space between the projection system and the substrate.

21. A substrate table for a lithographic apparatus, the substrate table comprising:
a support body having a support surface configured to contact a substrate, the support body having an upper surface;
a measurement system component attached to the substrate table, the measurement system component either comprising a sensor configured to detect radiation redirected by a grating to measure a relative position between the substrate table and the grating or comprising the grating;
a barrier associated with the measurement system component, the barrier positioned to hinder contamination from reaching the associated grating or sensor of the measurement system component; and
a temperature conditioning device configured to cause, at a location behind a surface of the barrier, a temperature change in the associated grating or sensor of the measurement system component back toward a nominal temperature for the associated grating or sensor of the measurement system component,
wherein the measurement system component is mounted on a bracket attached to and protruding from the support body.

* * * * *